United States Patent
Baur et al.

(10) Patent No.: US 12,284,849 B2
(45) Date of Patent: Apr. 22, 2025

(54) SEMICONDUCTOR COMPONENT WITH RADIATION CONVERSION ELEMENT, AND METHOD FOR PRODUCING RADIATION CONVERSION ELEMENTS

(71) Applicant: OSRAM Opto Semiconductors GmbH, Regensburg (DE)

(72) Inventors: Johannes Baur, Regensburg (DE); Ulrich Steegmüller, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 388 days.

(21) Appl. No.: 17/616,530

(22) PCT Filed: May 25, 2020

(86) PCT No.: PCT/EP2020/064398
§ 371 (c)(1),
(2) Date: Dec. 3, 2021

(87) PCT Pub. No.: WO2020/244949
PCT Pub. Date: Dec. 10, 2020

(65) Prior Publication Data
US 2022/0254965 A1    Aug. 11, 2022

(30) Foreign Application Priority Data
Jun. 6, 2019  (DE) ............... 10 2019 115 351.4

(51) Int. Cl.
*H10H 20/851*   (2025.01)
*H10H 20/01*    (2025.01)
*H10H 20/811*   (2025.01)

(52) U.S. Cl.
CPC ...... *H10H 20/8513* (2025.01); *H10H 20/013* (2025.01); *H10H 20/811* (2025.01); *H10H 20/01* (2025.01); *H10H 20/0361* (2025.01)

(58) Field of Classification Search
CPC ....................................................... H01L 33/04
See application file for complete search history.

(56) References Cited

U.S. PATENT DOCUMENTS

| 8,426,871 B2 | 4/2013 | Rapoport et al. |
| 2002/0140012 A1* | 10/2002 | Droopad ........... H01L 21/02488 |
| | | 257/295 |

(Continued)

FOREIGN PATENT DOCUMENTS

| CN | 1758457 A  | 4/2006 |
| CN | 101496187 A | 7/2009 |

(Continued)

OTHER PUBLICATIONS

Japanese Office Action dated Jan. 5, 2023, JP Application No. 2021-572268, 17 pages (including English translation).

(Continued)

*Primary Examiner* — Moazzam Hossain
*Assistant Examiner* — Hajar Kolahdouzan
(74) *Attorney, Agent, or Firm* — MH2 Technology Law Group LLP

(57) ABSTRACT

The invention relates to a semiconductor component with a semiconductor chip and a radiation conversion element which is arranged on the semiconductor chip. The semiconductor chip has an active region which is designed to generate a primary radiation with a peak wavelength, the radiation conversion element has a quantum structure, the peak wavelength of the primary radiation lies in the infrared spectral range, and the quantum structure at least partly converts the primary radiation into a secondary radiation, (Continued)

wherein the emission wavelength of an emission maximum of the secondary radiation is greater than the peak wavelength. The invention additionally relates to a method for producing radiation conversion elements.

14 Claims, 12 Drawing Sheets

(56) References Cited

U.S. PATENT DOCUMENTS

| | | | |
|---|---|---|---|
| 2006/0071232 A1 | 4/2006 | Sasakura et al. | |
| 2006/0146903 A1 | 7/2006 | Sasakura et al. | |
| 2009/0302307 A1* | 12/2009 | Gronninger | H01L 33/06 257/14 |
| 2010/0283074 A1* | 11/2010 | Kelley | H01L 33/02 438/33 |
| 2013/0320299 A1 | 12/2013 | Li | |

FOREIGN PATENT DOCUMENTS

| | | |
|---|---|---|
| CN | 101821866 A | 9/2010 |
| DE | 102013112740 A1 | 5/2015 |
| DE | 102016117189 A1 | 3/2018 |
| JP | 2007506635 A | 3/2007 |
| JP | 2008078563 A | 4/2008 |
| JP | 2010238834 A | 10/2010 |
| JP | 2013539229 A | 10/2013 |
| JP | 2017524984 A | 8/2017 |
| KR | 20180076497 A | 7/2018 |
| KR | 1020190042913 A | 4/2019 |
| WO | 2009048704 A2 | 4/2009 |
| WO | 2009085594 A2 | 7/2009 |
| WO | 2019077034 A1 | 4/2019 |

OTHER PUBLICATIONS

International Search Report (with English Translation) and Written Opinion in corresponding International Application No. PCT/EP2020/064398 mailed on Jul. 31, 2020, 14 pages.
"Dowa Samples Highest Power Short-Wavelength IR LEDs," Sep. 2018, Retrieved from the Internet: https://compoundsemiconductor.net/article/105197/Dowa_Samples_Highest_Power_S. . . , pp. 1-2.
Chinese Office Action issued in Chinese Patent Application No. 202080041872.6 dated May 27, 2024, with English language translation, 21 pages.

* cited by examiner

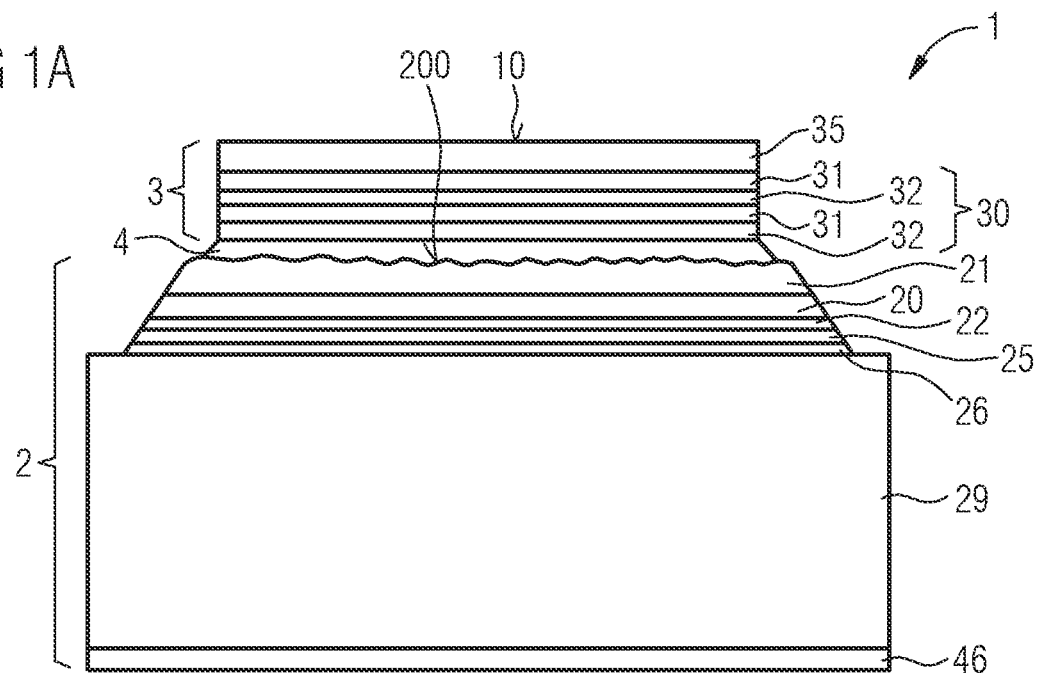
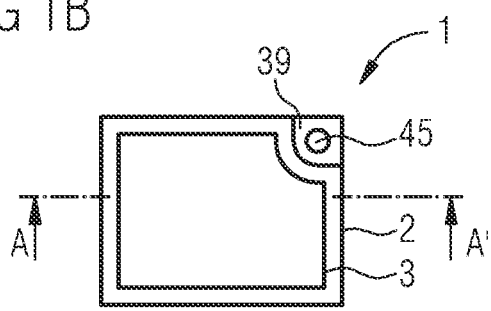
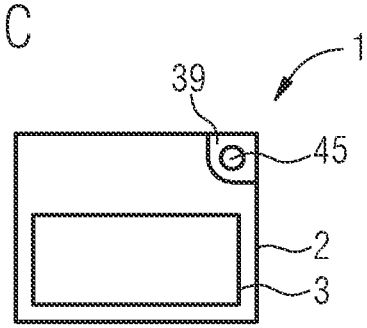
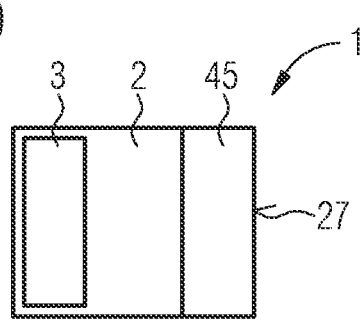
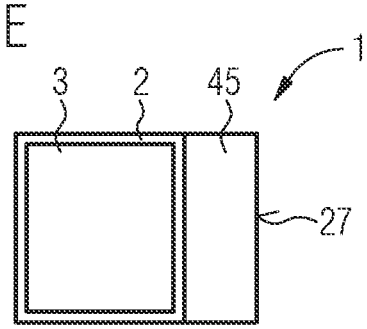

SEMICONDUCTOR COMPONENT WITH RADIATION CONVERSION ELEMENT, AND METHOD FOR PRODUCING RADIATION CONVERSION ELEMENTS

CROSS-REFERENCE TO RELATED APPLICATIONS

This patent application is a national stage entry from International Application No. PCT/EP2020/064398, filed on May 25, 2020, published as international Publication No. WO 2020/244949 A1 on Dec. 10, 2020, and claims priority under 35 U.S.C. § 119 from German patent application 10 2019 115 351.4, filed Jun. 6, 2019, the entire contents of all of which are incorporated by reference herein.

FIELD

The present application relates to a semiconductor component having a radiation conversion element and to a method for producing radiation conversion elements.

BACKGROUND

Light-emitting diodes that emit in the infrared spectral range, in particular light-emitting diodes with an emission wavelength greater than 1000 nm, may be produced on GaP substrates. These substrates are very expensive and only limitedly available, however, and the known emitters exhibit a relatively large lateral emission so that optical imageability is made more difficult.

It is an object to achieve efficient radiation generation in the infrared spectral range.

This object is achieved inter alia by a semiconductor component as claimed in patent claim 1, and by a method as claimed in patent claim 10 for producing radiation conversion elements. The dependent patent claims relate to further configurations and expediencies.

SUMMARY

According to at least one embodiment of the semiconductor component, the semiconductor component comprises a semiconductor chip. The semiconductor chip comprises, in particular, an active region intended to generate primary radiation with a peak wavelength. By application of an electrical voltage to the semiconductor chip, charge carriers from opposite sides can enter the active region during operation of the semiconductor component and recombine there while emitting radiation.

According to at least one embodiment of the semiconductor component, the semiconductor component comprises a radiation conversion element. The radiation conversion element is in particular arranged, for example fastened, on the semiconductor chip.

According to at least one embodiment of the semiconductor component, the peak wavelength of the primary radiation lies in the infrared spectral range. For example, the peak wavelength lies between 900 nm inclusive and 1100 nm. For example, the peak wavelength lies between 920 nm inclusive and 1080 nm.

According to at least one embodiment of the semiconductor component, the radiation conversion element comprises a quantum structure.

The term quantum structure in the scope of the application includes in particular any structure in which charge carriers can experience a quantization of their energy states by confinement. In particular, the term quantum structure contains no specification relating to the dimensionality of the quantization. It therefore includes inter alia quantum wells, quantum wires and quantum dots, or any combination of these structures.

For example, the quantum structure comprises a multiplicity of quantum layers, between which barrier layers are arranged. For example, the quantum layers and the barrier layers form a multiple quantum well (MQW) structure. The radiation conversion element comprises, for example, a substrate that is transparent for the primary radiation. The substrate is used in particular for mechanical stabilization of the quantum structure. For example, the substrate is at least two times or at least five times as thick as the quantum structure. The substrate is, for example, a growth substrate for the deposition, for example epitaxial deposition, of the quantum structure. As an alternative, the substrate may also be different than the growth substrate for the quantum structure. Furthermore, the radiation conversion element may also be without a substrate.

According to at least one embodiment of the semiconductor component, the quantum structure converts the primary radiation at least partially into secondary radiation, an emission wavelength of an emission maximum of the secondary radiation being greater than the peak wavelength. The emission maximum is, for example, a global maximum of the secondary radiation or a local maximum of the secondary radiation.

By means of the radiation conversion element, radiation generation may take place in a wavelength range which would not readily be achievable with the material system used for the active region of the semiconductor chip. For example, at least one emission maximum of the secondary radiation lies between 1000 nm inclusive and 1700 nm inclusive.

In at least one embodiment of the semiconductor component, the semiconductor component comprises a semiconductor chip and a radiation conversion element, the radiation conversion element being arranged on the semiconductor chip. The semiconductor chip comprises an active region intended to generate primary radiation with a peak wavelength. The radiation conversion element comprises a quantum structure. The peak wavelength of the primary radiation lies in the infrared spectral range. The quantum structure converts the primary radiation at least partially into secondary radiation, an emission wavelength of an emission maximum of the secondary radiation being greater than the peak wavelength.

According to at least one embodiment of the semiconductor component, the quantum structure comprises a multiplicity of quantum layers, which are separated from one another by barrier layers, the barrier layers having a band gap which is greater than an energy of the radiation with the peak wavelength.

In other words, the energy of the radiation with the peak wavelength is not sufficient to excite charge carriers in the barrier layers from the valence band into the conduction band. The radiation absorption of the primary radiation in the radiation conversion element thus takes place essentially directly inside the quantum layers.

According to at least one embodiment of the semiconductor component, the quantum structure comprises at least two quantum layers, which differ from one another in terms of their band gap. In other words, the emission spectrum of the quantum structure comprises at least two emission bands, their emission maxima being different to one another. For example, a spectral distance between two emission maxima of the secondary radiation is greater than the sum of the half widths at half maximum of the emission maxima. The emission maxima are clearly resolved in the emission spectrum. As an alternative, the spectral distance between neighboring maxima may be so small that the superposition of the emission bands leads overall to a broadened emission spectrum.

According to at least one embodiment of the semiconductor component, the quantum structure has a lattice constant of InP. The semiconductor material used for the quantum structure is thus epitaxially depositable, for example by means of MBE or MOVPE, on a growth substrate comprising InP. The material may be configured to be lattice-matched or strained, so long as the strains do not cause cracks in the crystal.

According to at least one embodiment of the semiconductor component, the quantum structure comprises at least one material from the group of the following material systems: $Ga_x In_{1-x} As_y P_{1-y}$, $In_x Ga_{1-x} As_y Sb_{1-y}$, $In_x Ga_{1-x} As$, $In_x Ga_{1-x} P_y Sb_{1-y}$, $In_x Al_{1-x} P_y Sb_{1-y}$, where x and y are respectively selected so that a lattice constant of the material corresponds to that of InP. Here, in each case, $x \leq 1$ and $y \leq 1$. In particular direct band gaps may be achieved with the aforementioned semiconductor materials, so that both light absorption and emission may take place efficiently.

The lattice constant of the material corresponding to that of InP means that the intrinsic lattice constant of the material is equal to that of InP or that the deviations are at least so small that the material grows with a strain on InP without relaxing.

For example, an intrinsic lattice constant of the material for the quantum structure differs by at most 2%, in particular at most 1%, from the lattice constant of InP.

With the aforementioned materials, emission wavelengths of between 1000 nm inclusive and 1700 nm inclusive may be achieved reliably.

According to at least one embodiment of the semiconductor component, the radiation conversion element covers at least 90% of the active region of the semiconductor chip in a plan view of the semiconductor component. In particular, the radiation conversion element may also fully cover the active region. Radiation emitted perpendicularly to a main extent plane of the active region thus cannot emerge from the semiconductor component, or can emerge only to a relatively small degree, without first passing through the radiation conversion element. Such a configuration is suitable in particular for a semiconductor component in which the primary radiation is not desired, or at least is not necessary, in the emission spectrum of the semiconductor component.

According to at least one embodiment of the semiconductor component, the radiation conversion element covers at most 80% of the active region of the semiconductor chip in a plan view of the semiconductor component. In this case, a significant part of the primary radiation also emerges from the semiconductor component. The spectral width of the emission spectrum is thereby increased overall. A semiconductor component in which the primary radiation is also contained in the overall spectrum is suitable in particular for applications in which broadband emission is desired, for example for biosensor applications.

According to at least one embodiment of the semiconductor component, the radiation conversion element has a thickness of at most 200 µm. The thickness refers in this case to an extent perpendicular to the main extent plane of the active region. The thinner the radiation conversion element is, the less radiation is emitted laterally from the radiation conversion element during operation of the semiconductor component. The radiation emitted overall may thus be shaped more easily by an optical element downstream of the semiconductor component.

According to at least one embodiment of the semiconductor component, the semiconductor chip comprises a carrier, a mirror layer, in particular a metallic mirror layer, being arranged between the active region and the carrier.

In particular, the carrier is different than a growth substrate for the active region of the semiconductor chip. Such semiconductor chips may also be referred to as thin-film semiconductor chips. In such a thin-film semiconductor chip, the lateral emission is reduced in favor of increased radiation through a radiation emission face, lying opposite the mirror layer, of the semiconductor chip.

A thin-film semiconductor chip is suitable in combination with the described radiation conversion element particularly in order to reduce lateral emission of the semiconductor component and to improve the optical imageability of the emitted radiation. Furthermore, the proportion of primary radiation which emerges laterally from the semiconductor chip, and consequently does not impinge on the radiation conversion element, may be reduced. In this way, the proportion of primary radiation in the emission spectrum could be increased, particularly for relatively large emission angles.

A method for producing a multiplicity of radiation conversion elements is furthermore provided.

According to at least one embodiment of the method, a semiconductor layer sequence having a quantum structure is deposited on a substrate, for example by means of MBE or MOVPE.

The quantum structure is, for example, deposited as a monocrystalline layer with lattice matching on a substrate comprising InP. In particular, at least one deposition surface of the substrate is formed by InP. In this way, high layer qualities with an optimal absorption efficiency and emission efficiency may be achieved particularly reliably.

According to at least one embodiment of the method, the semiconductor layer sequence is divided into the multiplicity of radiation conversion elements. A multiplicity of radiation conversion elements may thus be produced simultaneously in a wafer panel, the radiation conversion elements being obtained during the division of the panel.

According to at least one embodiment of the method, the substrate is at least partially removed from the quantum structure, in particular before the division. The substrate is thus no longer present, or is present only partly, in particular with a reduced thickness, in the completed radiation conversion element.

According to at least one embodiment of the method, a sacrificial layer is removed for the at least partial removal of the substrate from the quantum structure. The sacrificial layer is located between the quantum structure and a rear side of the substrate, facing away from the quantum structure, for example between the quantum structure and a deposition face of the substrate. The sacrificial layer is, for example, a layer which can be removed simply and reliably by a chemical method.

According to at least one embodiment of the method, separation nuclei are introduced into the substrate and a part of the substrate is separated along the separation nuclei. The separation nuclei may, for example, be introduced by ion implantation. The separation may, for example, be carried out by heating the substrate.

According to at least one embodiment of the method, at least a part of the substrate is reused for the deposition of a semiconductor layer sequence having a quantum structure in a further production cycle of the method. In this way, the production costs for the radiation conversion elements may be reduced further.

According to at least one embodiment of the method, the substrate is thinned before the division. This is carried out for example by a mechanical method, for instance by grinding, polishing or lapping. The more the substrate is thinned, the less the lateral emissions from the radiation conversion element can be. During the deposition of the semiconductor layer sequence for the quantum structure, on the other hand, the substrate may have a greater thickness so that the substrate has a sufficient mechanical stability even at the relatively high temperatures of the deposition for the semiconductor layer sequence.

The described method is particularly suitable for the production of a radiation conversion element as described above. Features described in connection with the methods may therefore also be employed for the radiation conversion element, and vice versa.

With the described semiconductor component, or the described method, the following effects in particular may be achieved.

A material system with which the primary radiation can be generated efficiently, in particular by electrical excitation, may be used for the active region. Only relatively little technological outlay is therefore incurred for the generation of radiation with the desired longer wavelength, particularly in comparison with the establishment of a new material system for the semiconductor chips.

Manufacturing processes similar to the established technology for light sources for generating radiation, which generate radiation appearing white to the human eye or other radiation in the visible spectral range, may be used for the production of the semiconductor chips.

By means of a radiation conversion element comprising a quantum structure, the spectral characteristic of the emission of the semiconductor component may be adapted particularly simply and reliably to given requirements, for example by means of varying the band gap and/or the layer thickness of the quantum layers of the quantum structure. In contrast thereto, the emission spectrum of phosphors emitting in the infrared spectral range is scarcely adjustable. The emission wavelengths of the secondary radiation are tunable over the entire spectral range of from 1000 nm to 1800 nm.

Furthermore, a multiband emission and/or a spectrally broad emission is readily achievable, if desired, by variation of the quantum layers of the radiation conversion element.

The excitation may be carried out with relatively longwave radiation. Because of a small spectral distance between the primary radiation and the secondary radiation, a high efficiency of the semiconductor component is achieved with, at the same time, a small Stokes shift.

BRIEF DESCRIPTION OF THE DRAWINGS

Further configurations and expediencies may be found from the following description of the exemplary embodiments in conjunction with the figures, in which:

FIGS. 1A, 1B, 1C, 1D and 1E show exemplary embodiments of a semiconductor component in a schematic sectional view (FIG. 1A) or in a schematic plan view (FIGS. 1B to 1E);

DETAILED DESCRIPTION

Figure 2A:
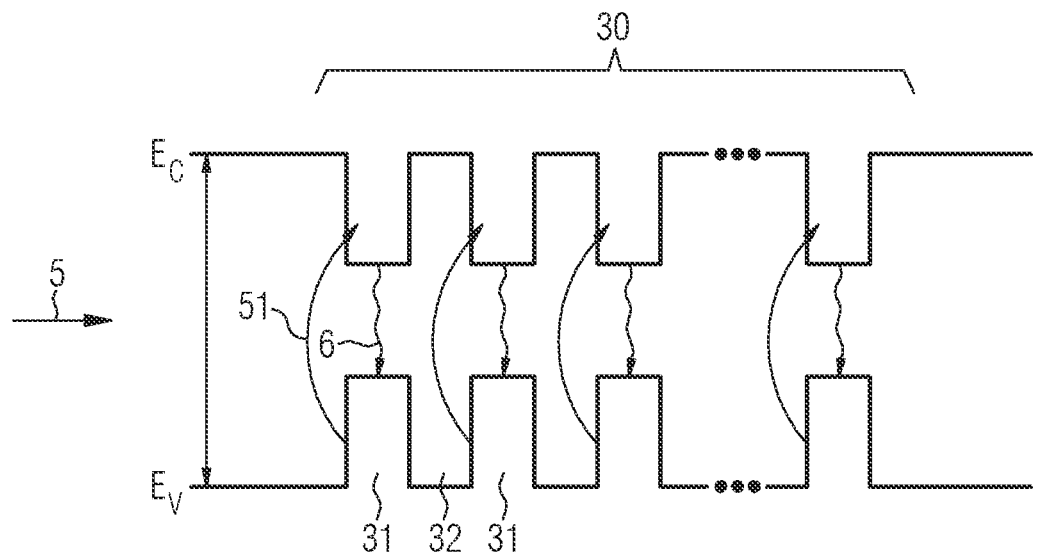
FIGS. 2A and 2B respectively show schematic representations of exemplary embodiments of a band structure of a radiation conversion element.

Elements which are the same, or of the same type, or which have the same effect, are provided with the same references in the figures.

The figures are respectively schematic representations and are therefore not necessarily true to scale. Rather, relatively small elements, and in particular layer thicknesses, may be represented as being exaggeratedly large for illustration.

FIG. 1A represents an exemplary embodiment of a semiconductor component 1 in a sectional view along the line AA' shown in FIG. 1B. The semiconductor component 1 comprises a semiconductor chip 2 having an active region 20 intended for generating primary radiation. The active region is located between a first semiconductor layer 21 and a second semiconductor layer 22 of the semiconductor chip. For example, the first semiconductor layer 21 is n-conductive and the second semiconductor layer 22 is p-conductive, or vice versa. By application of an external electrical voltage between one contact 45 and a further contact 46 of the semiconductor chip, charge carriers from opposite sides can enter the active region 20 through the first semiconductor layer 21 and the second semiconductor layer 22 and recombine there while emitting primary radiation.

A radiation conversion element 3 is arranged on the semiconductor chip 2. The radiation conversion element 3 is fastened on the semiconductor chip 2 by a bonding layer 4. For example, the bonding layer contains a silicone or an epoxide. The bonding layer 4 is expediently transparent for the radiation generated in the active region 20.

The radiation conversion element 3 comprises a quantum structure 30. For simplified representation, two quantum layers 31 and two barrier layers 32 are shown in FIG. 1A. The number of quantum layers may however vary in wide limits, for example between one quantum layer inclusive and 50 quantum layers inclusive.

The quantum structure 30 is arranged on a substrate 35 of the radiation conversion element 3. For example, the substrate is a growth substrate for the deposition, in particular epitaxial deposition, of the quantum structure 30. The growth substrate for the semiconductor layers of the quantum structure 30 must be contained in the semiconductor component 1, although not fully, but may fully or partially have been removed during the production of the radiation conversion element 3.

A peak wavelength of the primary radiation lies, for example, in the infrared spectral range. For example, the peak wavelength lies between 920 nm inclusive and 1070 nm inclusive, in particular between 940 nm inclusive and 1000 nm.

For example, the active region 20 of the semiconductor chip 2 is based on the material system $In_x Ga_y Al_{1-x-y} As_z P_{1-z}$. The parameters x, y and z of the material composition are, in particular, selected so that the material may be deposited in a monocrystalline fashion on a GaAs substrate as the growth substrate.

In the exemplary embodiment shown, the semiconductor chip 2 is configured as a thin-film semiconductor chip in which the growth substrate for the semiconductor layer sequence with the active region 20 is no longer present in the completed semiconductor chip. The semiconductor layer sequence with the active region 20 is fastened on a carrier 29 by means of a connecting layer 26. The carrier 29 itself need not satisfy the stringent requirements for the crystalline purity of a growth substrate. A mirror layer 25, in particular a metallic mirror layer, is furthermore arranged between the active region 20 and the carrier 29, so that radiation generated in the active region 20 and emitted in the direction of the carrier 29 is reflected and emerges at a radiation emission face 200 of the semiconductor chip 2, which lies opposite the carrier 29.

The primary radiation generated in the active region 20 is at least partially converted into secondary radiation in the quantum structure 30 of the radiation conversion element 3.

The barrier layers are preferably selected in terms of their material composition in such a way that they have a band gap which is greater than an energy of the radiation of the primary radiation with the peak wavelength. This is represented in FIG. 2A with the aid of a schematic representation of a valence band $E_V$ and conduction band $E_C$ of the quantum structure 30. The primary radiation 5, represented by an arrow, is absorbed not in the barrier layers 32 but in the quantum layers 31. An excitation 51 resulting therefrom is illustrated by an arrow.

The secondary radiation 6 may subsequently be emitted with a longer wavelength, represented by an arrow. This emission takes place, for example, from a ground state of a quantum well formed by the quantum layer. Direct optical excitation of the quantum layers 31, and therefore particularly efficient radiation conversion, thus take place.

In the exemplary embodiment represented in FIG. 2A, the band gaps of the quantum layers 31 do not differ from one another, or differ only slightly. This leads to a spectrally narrow-band emission spectrum.

Figure 2B:
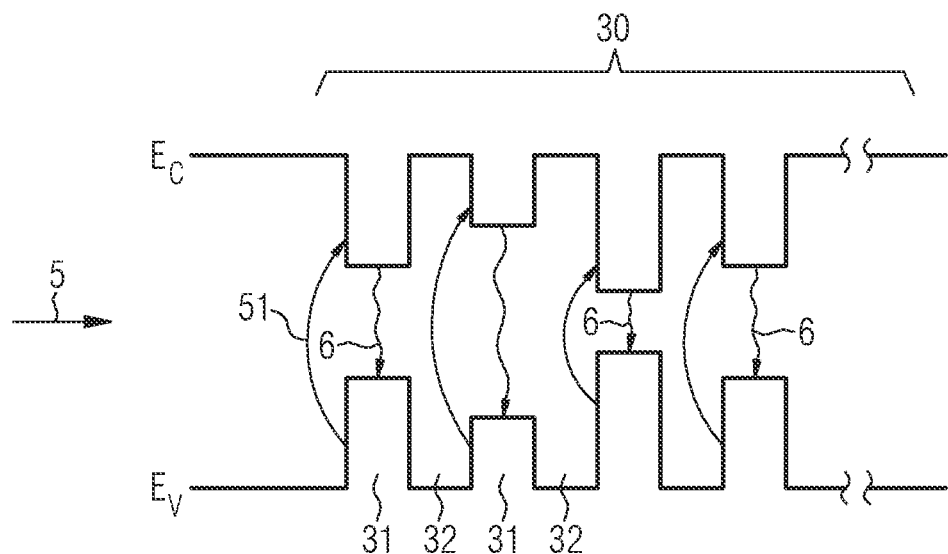

In contrast thereto, FIG. 2B shows an exemplary embodiment in which at least two quantum layers 31 differ from one another in terms of their band gap. The emission spectrum of the semiconductor component may be adapted simply and reliably to a predetermined emission characteristic by the selection of the material parameters for the quantum layers 31 of the quantum structure.

FIGS. 3A to 3D show various configurations of the emission spectrum of the semiconductor component, the intensity in arbitrary units respectively being represented as a function of the wavelength λ. The lines 901 respectively represent the primary radiation and the lines 902 respectively represent the secondary radiation. In the exemplary embodiment represented in FIG. 3A, the secondary radiation has precisely one emission maximum, which represents a global maximum.

Figure 3A:
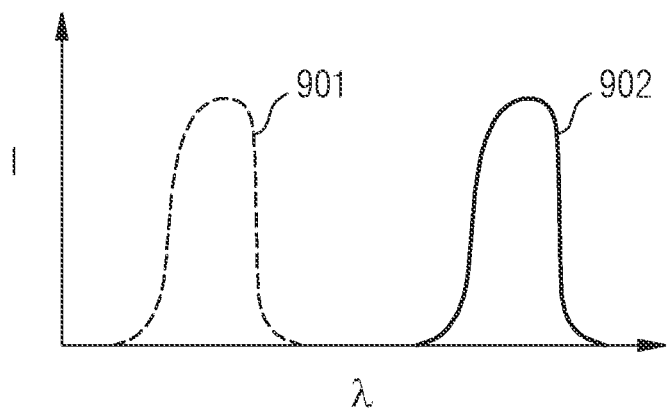
FIGS. 3A, 3B, 3C and 3D respectively show an exemplary embodiment of an emission spectrum of the semiconductor component.
Figure 3B:
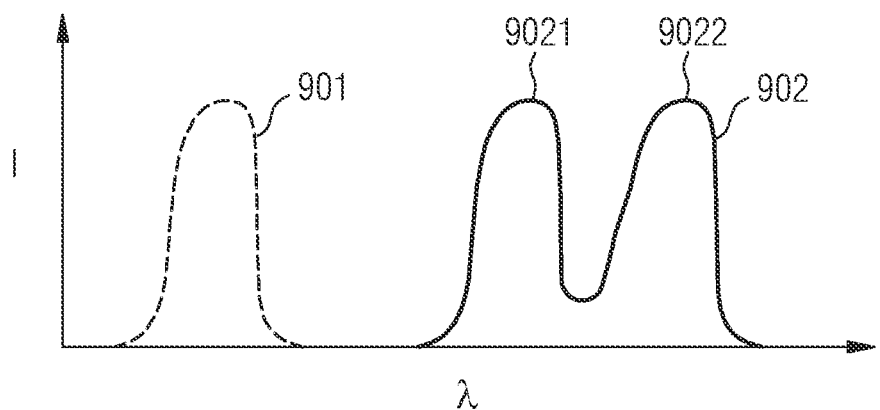

By mutually different quantum layers however, as represented in FIG. 3B, it is also possible to achieve an emission spectrum in which the secondary radiation has two or more mutually separated emission bands with mutually different emission maxima 9021 and 9022, respectively. For example, the spectral distance between two emission maxima 9021, 9022 may be greater than the sum of the half widths at half maximum (HWHM) of the emission bands, so that the emission spectrum has emission maxima that are significantly different to one another in the secondary radiation.

Figure 3C:
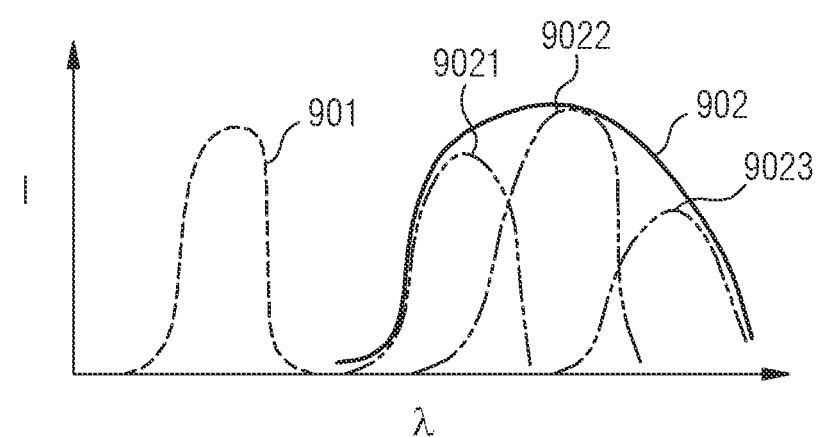

As an alternative, the distance between neighboring emission maxima may also be smaller, as is represented in FIG. 3C. In this case, the emission maxima 9021, 9022 and 9023 may be superimposed to form a common spectrally broadened emission peak, so that the semiconductor component 1 is spectrally distinguished by particularly broad emission. The emission spectrum of the secondary radiation may thus be broadened by deliberate variation of the quantum layers.

Figure 3D:
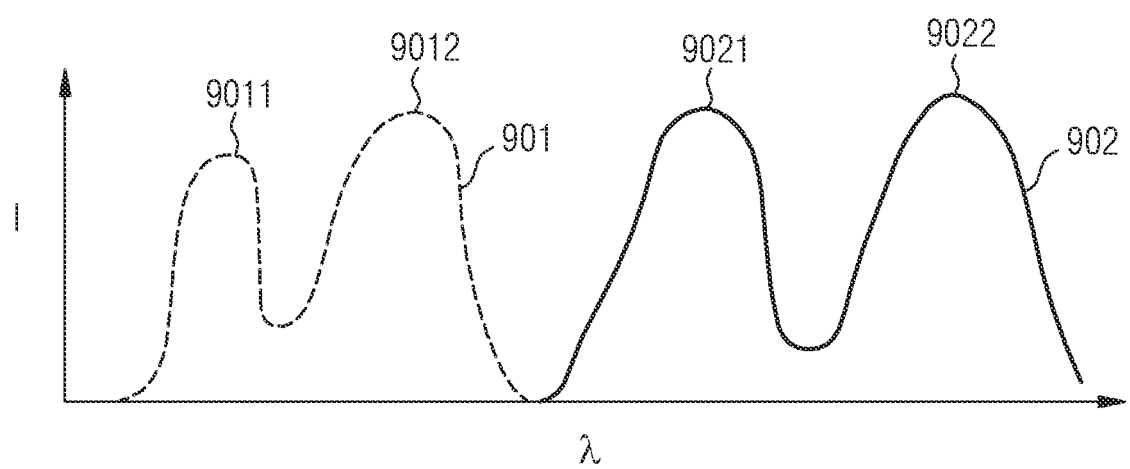

The spectrum of the primary radiation 901 may also, as illustrated in FIG. 3D, have more than one emission maximum, for example one emission maximum 9011 and a further emission maximum 9012.

Materials which can be deposited epitaxially on InP are particularly suitable for the quantum structure 30.

For example, the quantum structure comprises at least one material from the group of the following material systems: $Ga_x In_{1-x} As_y P_{1-y}$, $In_x Ga_{1-x} As_y Sb_{1-y}$, $In_x Ga_{1-x} As$, $In_x Ga_{1-x} P_y Sb_{1-y}$, $In_x Al_{1-x} P_y Sb_{1-y}$, where x and y are respectively selected so that the lattice constant of the material corresponds to, or is at least close to, that of InP. In particular, a peak wavelength which is at least 920 nm, for example at least 930 nm or at least 940 nm, is suitable for the primary radiation, so that the primary radiation is not absorbed by an InP substrate 35 of the radiation conversion element 3 and barrier layers 32 made of the same material.

The proportion of the primary radiation in the emission spectrum of the semiconductor component 1 may also be adjusted by means of the degree of coverage of the radiation emission face 200 of the semiconductor chip 2 by the radiation conversion element 3. This is illustrated with the aid of FIGS. 1B to 1E. In the exemplary embodiment represented in FIG. 1B, the semiconductor chip 2 comprises a front-side contact 45 in a corner region of the semiconductor chip 2. The radiation conversion element 3 comprises a recess 39 so that the contact 45 is accessible for the external electrical contacting of the semiconductor component 1, for example by means of a wire bond connection. The active region 20 is fully covered, or at least substantially fully covered, for example with a degree of coverage of at least 90°. The primary radiation emerging through the radiation emission face 200 thus has to pass through the radiation conversion element 3 before it can emerge at a front side 10 of the semiconductor component 1.

In contrast thereto, the radiation conversion element 3 in the exemplary embodiment represented in FIG. 1C covers the active region 20 of the semiconductor chip 2 only partially, for example with a degree of coverage of at most 80% or at most 60%. A significant proportion of the primary radiation therefore emerges laterally with respect to the radiation conversion element 3 at the front side 10 of the semiconductor component 1. This is favorable in particular when the primary radiation is desired in the emission spectrum of the semiconductor component 1.

The exemplary embodiments in FIGS. 1D and 1E differ from the exemplary embodiments according to FIGS. 1B and 1C in that the contact 45 extends not in a corner region but along a side face 27 of the semiconductor chip 2. In the exemplary embodiment represented in FIG. 1D, as described in connection with FIG. 1C, the radiation conversion element 3 covers the active region 20 of the semiconductor chip 2 only regionally, so that a significant proportion of the radiation emission face of the semiconductor chip 2 remains without the radiation conversion element. In the exemplary embodiment represented in FIG. 1E, the radiation emission face is covered fully, or substantially fully, by the radiation conversion element 3. For this, the radiation conversion element may have a simple shape, for example rectangular.

Figure 4:
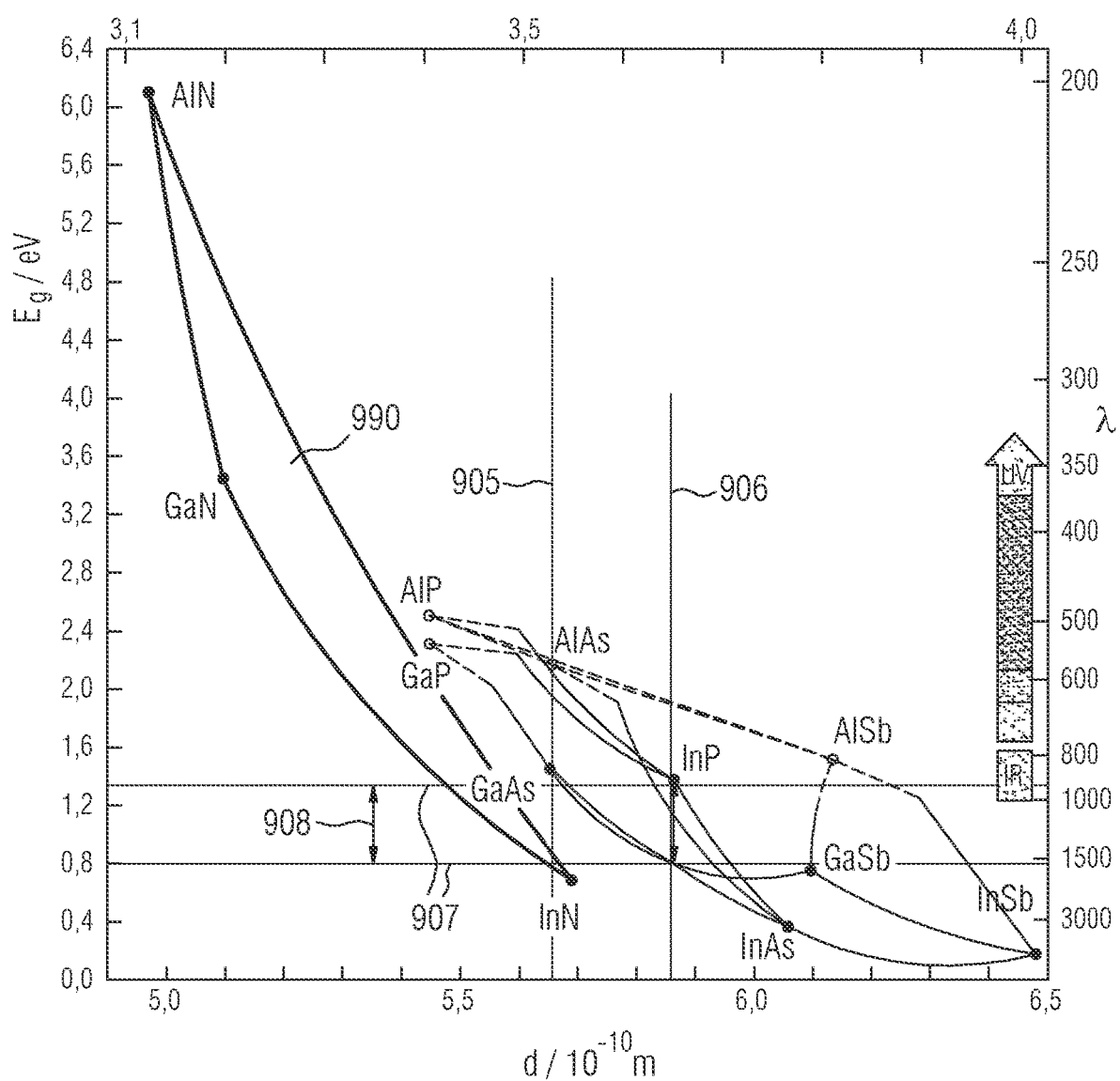
FIG. 4 shows an illustration of possible emission wavelengths achievable with different semiconductor material systems, the band gap $E_G$ (left scale) and the associated emission wavelength λ (right scale) being represented as a function of the lattice constants d.

FIG. 4 illustrates the emission wavelength which may be achieved with particular material systems. The lines 905 and 906 in this case illustrate the lattice constant of gallium arsenide or indium phosphide. It may be seen therefrom that emission in the spectral range of between 1000 nm inclusive and 1700 nm inclusive is not readily achievable with the lattice constant of gallium arsenide. In contrast to the other material systems represented, the material system of the nitride semiconductors 990 with the vertices InN, GaN and AlN grows not in the zinc blende structure but in the wurtzite structure, and is therefore not readily combinable with the other material systems represented.

With the lattice constant of InP, however, a spectral range of between 1000 nm inclusive and 1700 nm inclusive is achievable. This is illustrated with the aid of an arrow 908 between two lines 907.

Figure 5A:
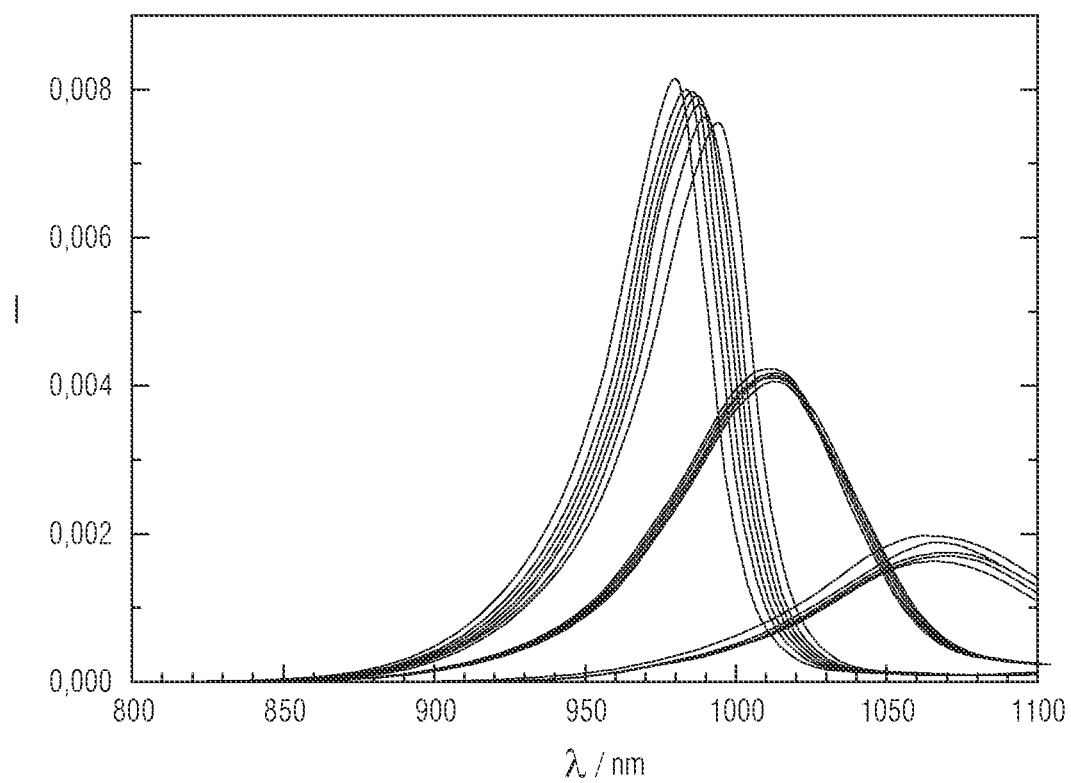
FIG. 5A shows examples of measurement data for the intensity in arbitrary units as a function of the wavelength for different light-emitting diodes.

FIG. 5A represents measurements of the intensity of the emitted radiation for different light-emitting diodes, which were respectively deposited on a GaAs substrate. While radiation with a peak wavelength of between 950 nm and 1000 nm can be generated efficiently, the intensity decreases significantly for comparative samples with peak wavelengths greater than 1000 nm. This material system is thus only limitedly suitable for direct radiation generation with peak wavelengths greater than 1000 nm.

Figure 5B:
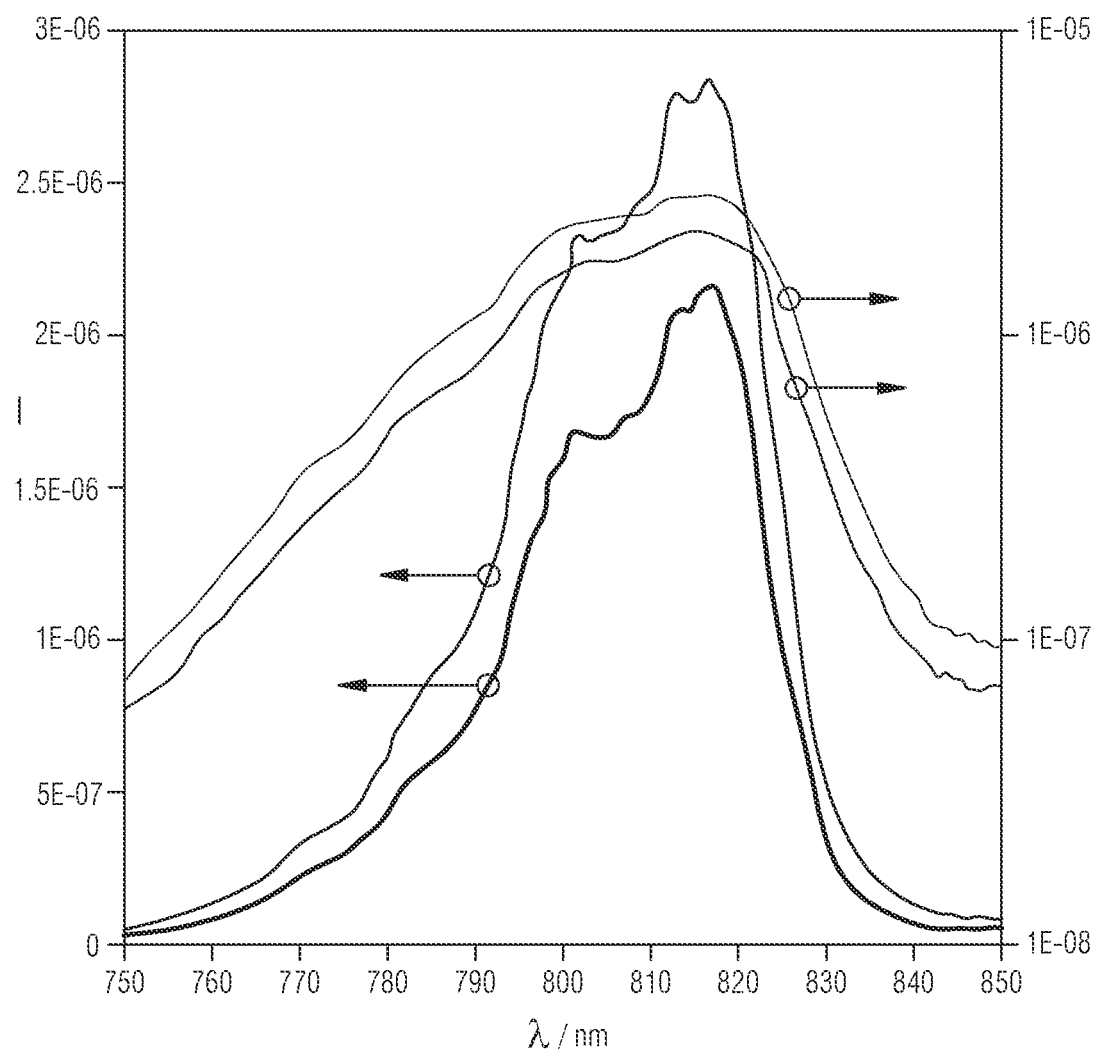
FIG. 5B shows examples of measurement data for the intensity as a function of the wavelength for a light-emitting diode with two different currents, on a linear scale in arbitrary units (left) and on a corresponding logarithmic scale (right)

FIG. 5B represents measurements of the intensity as a function of the wavelength for a light-emitting diode with two different operating currents. For this light-emitting diode, the layer thicknesses were increased in the active region for some quantum layers. This leads to two emission bands, which are separated from one another by about 15 nm. This results in a broadened emission spectrum. This procedure may also be applied to the quantum structure of the described radiation conversion element and to other emission wavelengths, so that a broadened emission spectrum of the secondary radiation may be achieved (cf. FIG. 3C).

Figure 5C:
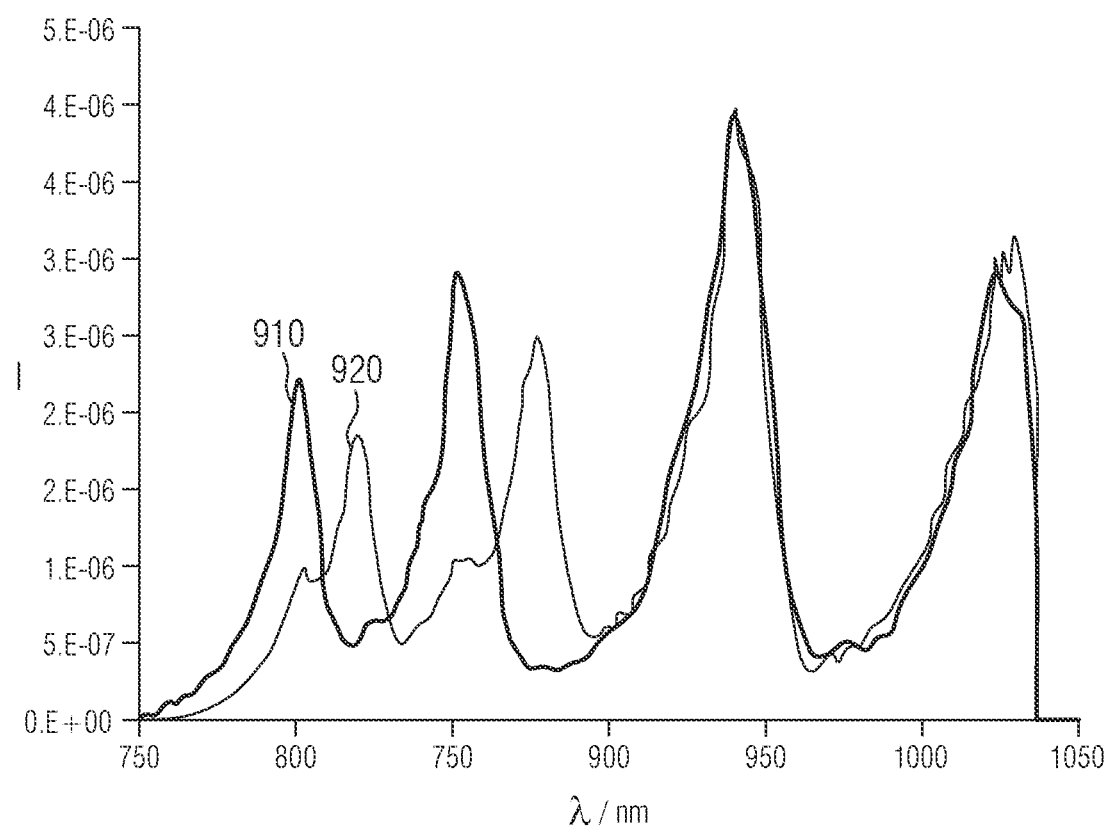
FIG. 5C shows examples of electro-optical intensity measurements in arbitrary units from two epitaxial substrates with different quantum structures as a function of the wavelength.

FIG. 5C represents electro-optical measurements for two substrates on which two active regions, which are electrically connected to one another via a tunnel junction, are respectively deposited. Curve 910 is based on a structure in which a first active region comprises quantum layers for emission at 810 nm and quantum layers for emission at 1020 nm. A second active region comprises quantum layers for emission at 850 nm and quantum layers for emission at 940 nm. This procedure may also be applied to the quantum structure of the described radiation conversion element and to other emission wavelengths, so that an emission spectrum of the secondary radiation with individual, mutually separated emission bands may be achieved (cf. FIG. 3D).

Curve 920 is based on a modified structure in which some quantum layers of the emission bands at 810 nm and 850 nm have deliberately been configured with a larger layer thickness. This leads to additional emission at somewhat longer wavelengths. The spectrum thus has individual emission bands, the emission peaks in part being deliberately broadened.

Overall, the measurement results of FIGS. 5B and 5C confirm the great flexibility in the configuration of the emission spectrum of a quantum structure.

Figure 6A:
FIGS. 6A to 6C, 7A to 7C, 8A to 8D and 9A to 9D respectively show an exemplary embodiment of a method for producing radiation conversion elements, with the aid of schematically represented intermediate steps.
Figure 6B:
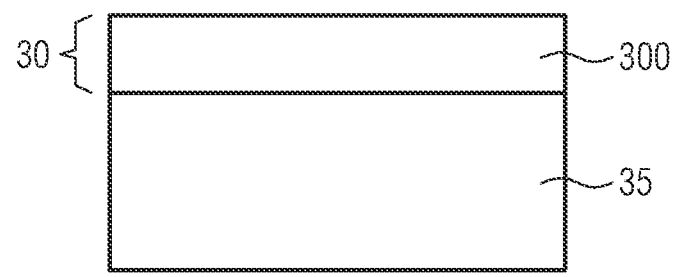
Figure 6C:
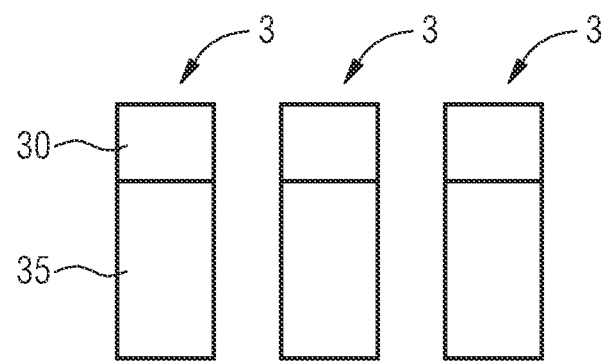

FIGS. 6A to 6C describe an exemplary embodiment of a method for producing a radiation conversion element. As represented in FIG. 6B, a semiconductor layer sequence 300 having a quantum structure 30 is epitaxially deposited on a substrate 35. Division into a multiplicity of radiation conversion elements 3 is then carried out. The division is carried out for example mechanically, for instance by sawing, chemically, for instance by etching, or by means of laser separation.

Recesses for the radiation conversion elements to be produced may also be formed before or during the division. Radiation conversion elements which do not have a rectangular cross section may thus be produced in a straightforward way (compare the radiation conversion element 3 represented in FIG. 1B with the recess 39).

The radiation conversion elements produced in this way may in other regards be configured as described in connection with the preceding figures, and will therefore not be explained in detail here.

The divided radiation conversion elements 3 may subsequently be placed and fastened on semiconductor chips in order to produce semiconductor components.

The size of the substrates 35 for the radiation conversion elements 3 is therefore independent of the size of the substrates on which the production of the semiconductor chips is carried out. For example, more economical 4" substrates may be used for the radiation conversion elements even if the production of the semiconductor chips is carried out on the basis of 6" processes.

Figure 7A:
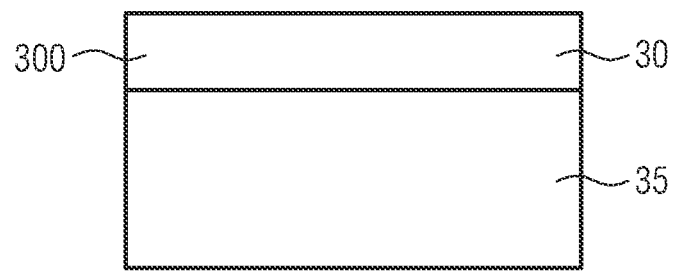
Figure 7B:
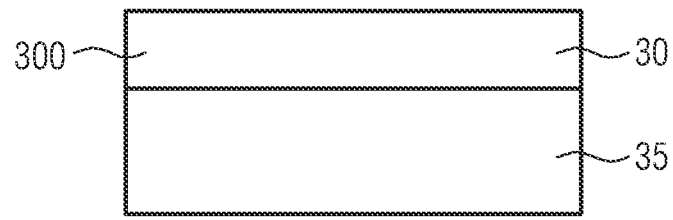
Figure 7C:
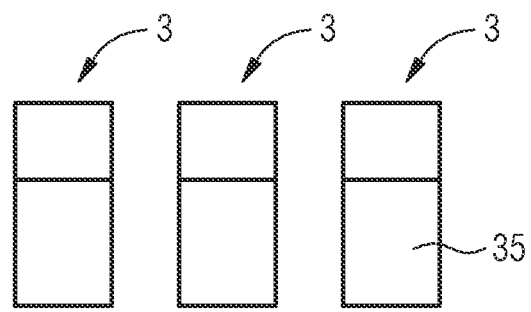

The exemplary embodiment represented in FIGS. 7A to 7C differs from the exemplary embodiment described in connection with FIGS. 6A to 6C in that the substrate 35 is thinned, for example by a mechanical method such as grinding (FIG. 7B), after the deposition of the quantum structure 30 (FIG. 7A). The division is then carried out (FIG. 7C). In this way, the thickness of the substrate remaining in the radiation conversion element 3 may be reduced. The smaller the thickness of the substrate is, the lower the proportion of the radiation which emerges laterally from the radiation conversion element can be.

For example, the radiation conversion element has a thickness of at most 200 μm after the thinning.

Figure 8A:
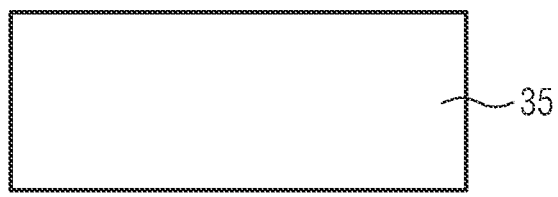
Figure 8B:
Figure 8C:
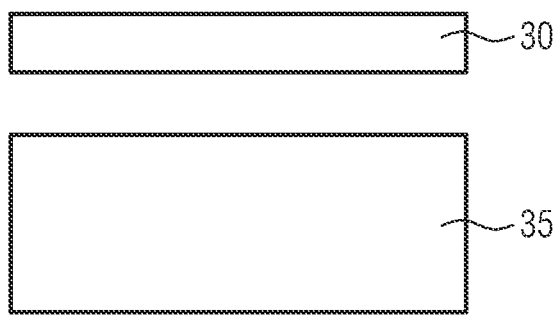
Figure 8D:
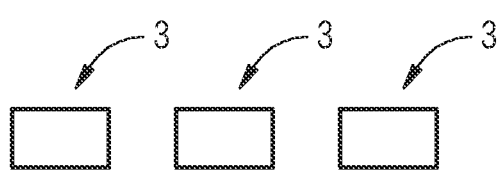

FIGS. 8A to 8D describe a method by which the radiation conversion elements 3 can be produced without the original substrate. For this, a sacrificial layer 37 is arranged between the substrate 35 and the quantum structure 30 (FIG. 8B). This sacrificial layer may subsequently be removed, for example by a selective etching method, so that the quantum structure 30 and the substrate 35 are separated from one another (FIG. 8C).

The separation of the quantum structure and the substrate is expediently carried out before the division (FIG. 8D), so that the substrate 35 may be used again for the deposition of a semiconductor layer sequence in a further production cycle. By this re-use of the relatively expensive growth substrate, the production costs for the radiation conversion element may be reduced further. Furthermore, particularly thin radiation conversion elements may be produced.

In the exemplary embodiment described in FIGS. 9A to 9D, the substrate 35 comprises separation nuclei 38. These separation nuclei may, for example, be introduced into the substrate by ion implantation. For example, implantation of hydrogen ions is suitable.

Figure 9A:
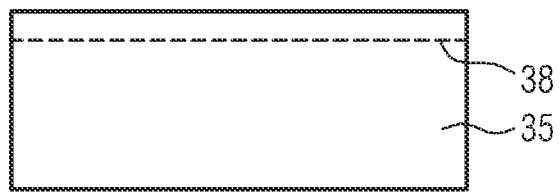
Figure 9B:
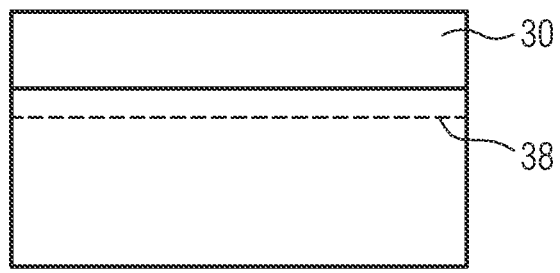

This may already be carried out before the deposition of the semiconductor layer sequence for the quantum structure 30 (FIG. 9B). In contrast thereto, it is also conceivable to deposit the quantum structure 30 first and to form the separation nuclei 38 subsequently.

Figure 9C:
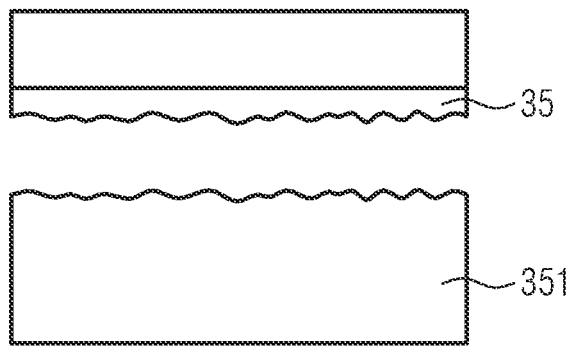

The substrate 35 may be split along the separation nuclei 38, for example by thermal splitting (FIG. 9C). A separated part 351 of the substrate is thereby formed.

Figure 9D:
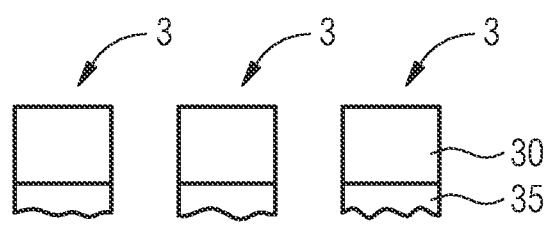

The division may finally be carried out as described in the preceding exemplary embodiments (FIG. 9D).

The separated part 351 may be used again as described in connection with FIGS. 8A to 8D, optionally after preparing the surface of the substrate.

With the described semiconductor component 1 and the described production method, radiation in the infrared spectral range, in particular between 1000 nm inclusive and 1700 nm inclusive, may be generated particularly efficiently. The emission spectrum may be adapted straightforwardly to the respective applications for the semiconductor component, in particular by selection of the material composition and layer thicknesses for the quantum layers of the quantum structure.

For example, the semiconductor components are suitable as light sources for analytical applications, for example for the detection of water or moisture. The secondary radiation may form the emission spectrum of the semiconductor component on its own, or it may be present in addition to the primary radiation.

Furthermore, particularly in combination with a semiconductor chip 2 configured as a thin-film semiconductor chip, predominant radiation emission may be achieved on the front side of the semiconductor component so that the spatial emission characteristic may be shaped more simply by means of a downstream optical element.

Thin-film technology in which GaAs growth substrates are removed may be used for this.

The invention is not restricted by the description with the aid of the exemplary embodiments. Rather, the invention comprises any new feature and any combination of features, which in particular includes any combination of features in the claims, even if this feature or this combination itself is not explicitly specified in the claims or exemplary embodiments.

The invention claimed is:

1. A semiconductor component having a semiconductor chip and a radiation conversion element, which is arranged on the semiconductor chip, wherein
the semiconductor chip comprises an active region intended to generate primary radiation with a peak wavelength;
the radiation conversion element comprises a monocrystalline quantum structure, positioned directly on a substrate of the semiconductor chip;
the quantum structure comprises a multiplicity of quantum layers, which are separated from one another by barrier layers and the quantum structure comprises at least one material from the group of the following material systems: $Ga_x In_{1-x} As_y P_{1-y}$, $In_x Ga_{1-x} As_y Sb_{1-y}$, $In_x Ga_{1-x} As$, $In_x Ga_{1-x} P_y Sb_{1-y}$, $In_x Al_{1-x} P_y Sb_{1-y}$, where x and y are respectively selected so that a lattice constant of the material corresponds to that of InP;
the peak wavelength of the primary radiation lies in the infrared spectral range; and
the quantum structure converts the primary radiation at least partially into secondary radiation, an emission wavelength of an emission maximum of the secondary radiation being greater than the peak wavelength; wherein
the radiation conversion element only partially covers at most 80% the active region.

2. The semiconductor component as claimed in claim 1, wherein the barrier layers have a band gap which is greater than an energy of the radiation with the peak wavelength.

3. The semiconductor component as claimed in claim 1, wherein the quantum structure comprises at least two quantum layers, which differ from one another in terms of their band gap.

4. The semiconductor component as claimed in claim 1, wherein the quantum structure has a lattice constant of InP.

5. The semiconductor component as claimed in claim 1, wherein the radiation conversion element covers at most 80% of the active region of the semiconductor chip in a plan view of the semiconductor component.

6. The semiconductor component as claimed in claim 1, wherein the radiation conversion element covers at least 90% of the active region of the semiconductor chip in a plan view of the semiconductor component.

7. The semiconductor component as claimed in claim 1, wherein the radiation conversion element has a thickness of at most 200 μm.

8. The semiconductor component as claimed in claim 1, wherein the semiconductor chip comprises a carrier and a mirror layer is arranged between the active region and the carrier.

9. A method for producing a multiplicity of radiation conversion elements comprising:
a) depositing a semiconductor layer sequence having a monocrystalline quantum structure directly on a substrate; and
b) dividing the semiconductor layer sequence into the multiplicity of radiation conversion elements; and
wherein the quantum structure comprises at least one material from the group of the following material systems: $Ga_x In_{1-x} As_y P_{1-y}$, $In_x Ga_{1-x} As_y Sb_{1-y}$, $In_x Ga_{1-x} As$, $In_x Ga_{1-x} P_y Sb_{1-y}$, $In_x Al_{1-x} P_y Sb_{1-y}$, where x and y are respectively selected so that a lattice constant of the material corresponds to that of InP; and wherein
the multiplicity of radiation conversion elements only partially covers at most 80% an active region of a corresponding semiconductor chip.

10. The method as claimed in claim 9, wherein the substrate is at least partially removed from the quantum structure.

11. The method as claimed in claim 10, wherein a sacrificial layer is removed.

12. The method as claimed in claim 10, wherein separation nuclei are introduced into the substrate and a part of the substrate is separated along the separation nuclei.

13. The method as claimed in claim 9, wherein at least a part of the substrate is reused for step a) in a further production cycle of the method.

14. The method as claimed in claim 9, wherein the substrate is thinned before step b).

* * * * *